US010018681B2

(12) United States Patent
Tsuruta

(10) Patent No.: US 10,018,681 B2
(45) Date of Patent: Jul. 10, 2018

(54) CELL MANUFACTURING USING LIQUID-BASED THERMAL SYSTEM

(71) Applicant: Tesla Motors, Inc., Palo Alto, CA (US)

(72) Inventor: Kunio Tsuruta, Mountain View, CA (US)

(73) Assignee: TESLA, INC., Palo Alto, CA (US)

(*) Notice: Subject to any disclaimer, the term of this patent is extended or adjusted under 35 U.S.C. 154(b) by 370 days.

(21) Appl. No.: 15/002,710

(22) Filed: Jan. 21, 2016

(65) Prior Publication Data

US 2016/0233559 A1 Aug. 11, 2016

Related U.S. Application Data

(60) Provisional application No. 62/113,770, filed on Feb. 9, 2015.

(51) Int. Cl.
| | |
|---|---|
| *H01M 4/82* | (2006.01) |
| *H01M 6/00* | (2006.01) |
| *G01R 31/36* | (2006.01) |
| *H01M 10/44* | (2006.01) |
| *H01M 10/04* | (2006.01) |
| *H01M 10/0525* | (2010.01) |
| *H01M 10/058* | (2010.01) |

(52) U.S. Cl.
CPC ...... *G01R 31/3658* (2013.01); *H01M 10/049* (2013.01); *H01M 10/441* (2013.01); *H01M 10/443* (2013.01); *H01M 10/446* (2013.01); *G01R 31/362* (2013.01); *H01M 10/058* (2013.01); *H01M 10/0525* (2013.01); *Y10T 29/49108* (2015.01)

(58) Field of Classification Search
CPC ............ G01R 31/3658; G01R 31/3651; G01R 31/362; H01M 10/443; H01M 10/049; H01M 10/42; H01M 10/441; H01M 10/446; H01M 10/058; H01M 10/0525; Y10T 29/49108; Y10T 29/49004
USPC ................................ 29/593, 623.1; 324/426
See application file for complete search history.

(56) References Cited

U.S. PATENT DOCUMENTS

| | | |
|---|---|---|
| 5,587,257 A | 12/1996 | Tibbetts et al. |
| 6,103,416 A | 8/2000 | Bauerlein et al. |
| 6,440,608 B1 | 8/2002 | Yoshioka et al. |
| 6,443,999 B1 | 9/2002 | Cantave et al. |
| 6,623,888 B1 | 9/2003 | Omaru et al. |
| 6,677,074 B2 | 1/2004 | Nishimura et al. |

(Continued)

*Primary Examiner* — Donghai D Nguyen
(74) *Attorney, Agent, or Firm* — Garlick & Markison; Bruce Garlick

(57) ABSTRACT

A method of manufacturing cells includes: assembling cells that include at least electrodes and electrolyte contained in a housing; after assembly, storing the cells in contact with a liquid-based thermal system; circulating liquid in the liquid-based thermal system at least while the cells are in contact with the liquid-based thermal system, the liquid having a first temperature; after storing the cells at the first temperature, and while the cells have at least a partial charge, performing a first open circuit voltage (OCV) test on the cells; after the first OCV test, storing the cells at a second temperature lower than the first temperature; after storing the cells at the second temperature, performing a second OCV test on the cells; and for each of the cells, discarding or keeping the cell based at least in part on the first and second OCV tests.

12 Claims, 4 Drawing Sheets

(56) References Cited

U.S. PATENT DOCUMENTS

| | | |
|---|---|---|
| 6,790,243 B2 | 9/2004 | Vaidyanathan |
| 7,300,723 B2 | 11/2007 | Fukuoka et al. |
| 7,604,895 B2 | 10/2009 | Kim et al. |
| 8,088,511 B2 | 1/2012 | Hermann et al. |
| 8,263,254 B2 | 9/2012 | Mehta et al. |
| 8,421,469 B2 * | 4/2013 | Hermann .............. H01M 10/42 324/426 |
| 8,435,668 B2 | 5/2013 | Kumar et al. |
| 8,628,872 B2 | 1/2014 | Koetting et al. |
| 8,642,203 B2 | 2/2014 | Joswig et al. |
| 9,209,496 B2 * | 12/2015 | Ro .......................... B07C 5/344 |
| 9,465,078 B2 * | 10/2016 | Betzner .............. G01R 31/3651 |
| 2009/0169989 A1 | 7/2009 | Morikawa et al. |
| 2010/0075221 A1 | 3/2010 | Mehta et al. |
| 2010/0086844 A1 | 4/2010 | Mehta et al. |
| 2010/0136387 A1 | 6/2010 | Kohn et al. |
| 2010/0136407 A1 | 6/2010 | Beecher et al. |
| 2010/0136421 A1 | 6/2010 | Hermann et al. |
| 2011/0117403 A1 | 5/2011 | Hermann et al. |
| 2011/0244333 A1 | 10/2011 | Kawada |
| 2013/0143115 A1 | 6/2013 | Sun et al. |
| 2013/0196184 A1 | 8/2013 | Faass et al. |
| 2013/0230764 A1 | 9/2013 | Park et al. |

* cited by examiner

CELL MANUFACTURING USING LIQUID-BASED THERMAL SYSTEM

CROSS-REFERENCE TO RELATED APPLICATION

This application claims the benefit of the filing date of U.S. provisional patent application 62/113,770, filed Feb. 9, 2015 and entitled "CELL MANUFACTURING USING LIQUID-BASED THERMAL SYSTEM," the entire contents of which are hereby incorporated herein by reference.

BACKGROUND

Manufacturing cells such as lithium-ion secondary cells is a complex process characterized both by the chemical interactions that must necessarily occur between the involved substances as well as the mechanical challenges in effectively and reliably assembling several components into a small housing in a sequence that often cannot be reversed. That is, cells are typically fully assembled and thereafter conditioned in a formation process involving electrical charging/discharging as well as heat treatment, before any realistic opportunity exists to quality check the cell. In addition, if a defective cell is discovered at such a late stage in the process, the cell must normally be discarded (e.g., sent to recycling) because there is no practical way to correct the defect at that point. As such, the formation process is an important part of cell manufacturing.

SUMMARY

In one aspect, a method of manufacturing cells includes: assembling cells that include at least electrodes and electrolyte contained in a housing; after assembly, storing the cells in contact with a liquid-based thermal system; circulating liquid in the liquid-based thermal system at least while the cells are in contact with the liquid-based thermal system, the liquid having a first temperature; after storing the cells at the first temperature, and while the cells have at least a partial charge, performing a first open circuit voltage (OCV) test on the cells; after the first OCV test, storing the cells at a second temperature lower than the first temperature; after storing the cells at the second temperature, performing a second OCV test on the cells; and for each of the cells, discarding or keeping the cell based at least in part on the first and second OCV tests.

Implementations can include any or all of the following features. The second temperature is about half the first temperature in ° C. The second temperature is about 20-25° C. The method further comprises, after the assembly and before storing the cells at the first temperature: subjecting the cells to an initial storage; after the initial storage, charging the cells with initially a constant current and thereafter at a constant voltage; after charging, discharging the cells at least partially; and after discharging, performing a third OCV test on the cells, wherein each of the cells is discarded or kept based at least in part on the first, second and third OCV tests. The method further comprises, after storing the cells at the first temperature and before the first OCV test, cooling the cells to the second temperature. Cooling the cells to the second temperature comprises circulating liquid having the second temperature in the liquid-based thermal system. The method further comprises performing a capacity check on the cells after the second OCV test. The capacity check comprises: charging the cells with initially a constant current and thereafter at a constant voltage equal to a target voltage of the cells; after charging, discharging the cells to below a predefined state-of-charge (SOC); after discharging, charging the cells to the predefined SOC; and after charging the cells to the predefined SOC, performing a third OCV test on the cells, wherein each of the cells is discarded or kept based at least in part on the first, second and third OCV tests. The method further comprises, for those of the cells that are kept after the first and second OCV tests, storing the kept cells.

In a second aspect, a method of manufacturing lithium-ion cells includes: assembling cells, the cells including at least electrodes and electrolyte in a housing; after assembly, subjecting the cells to a first storage period; after the first storage period, performing a charge/discharge of the cells, the charge/discharge including initially charging the cells with a constant current, thereafter charging the cells at a constant voltage, and thereafter discharging the cells at least partially; after the charge/discharge, performing a first open circuit voltage (OCV) test on the cells; after the first OCV test, subjecting the cells to a second storage period in contact with a liquid-based thermal system; circulating liquid in the liquid-based thermal system at least during the second storage period, the liquid having a second temperature higher than the first temperature; after the second storage period, cooling the cells from the second temperature down to about the first temperature; after cooling the cells down to about the first temperature, performing a second OCV test on the cells; after the second OCV test, subjecting the cells to a third storage period at the first temperature; after the third storage period, performing a third OCV test on the cells; after the third OCV test, performing a capacity check on the cells by charging the cells with initially a constant current and thereafter at a constant voltage equal to a target voltage of the cells, after charging, discharging the cells at least below a predefined state-of-charge (SOC), and, after discharging, charging the cells to the predefined SOC; after the capacity check, performing a fourth OCV test on the cells, wherein each of the cells is discarded or kept based in part on at least one of the first, second, third and fourth OCV tests; and for those of the cells that are kept after the fourth OCV test, subjecting the cells to a fourth storage period at the first temperature.

Implementations can include any or all of the following features. The second temperature is about twice the first temperature in ° C. Cooling the cells from the second temperature down to about the first temperature comprises circulating liquid having the first temperature in the liquid-based thermal system.

DETAILED DESCRIPTION

This document describes examples of cell manufacturing techniques, such as for lithium-ion secondary cells, involving thermal treatment using a liquid-based system. In some implementations, the liquid-based thermal system can be used for initiating and/or accelerating chemical reactions in the cells that are part of the manufacturing process. Moreover, cell capacity is proportional to the temperature of the treatment process. By keeping cell temperature more even during the thermal process, cell capacity can be detected more accurately. The heat transfer coefficient provided by liquid-based thermal conditioning can significantly reduce the time until each cell can be evaluated, thereby making the manufacturing process more effective. For example, energy can be saved and the cell aging time can be reduced. As another example, the accuracy in detecting defects based on the cell's open circuit voltage (OCV) can be improved.

Figure 1:
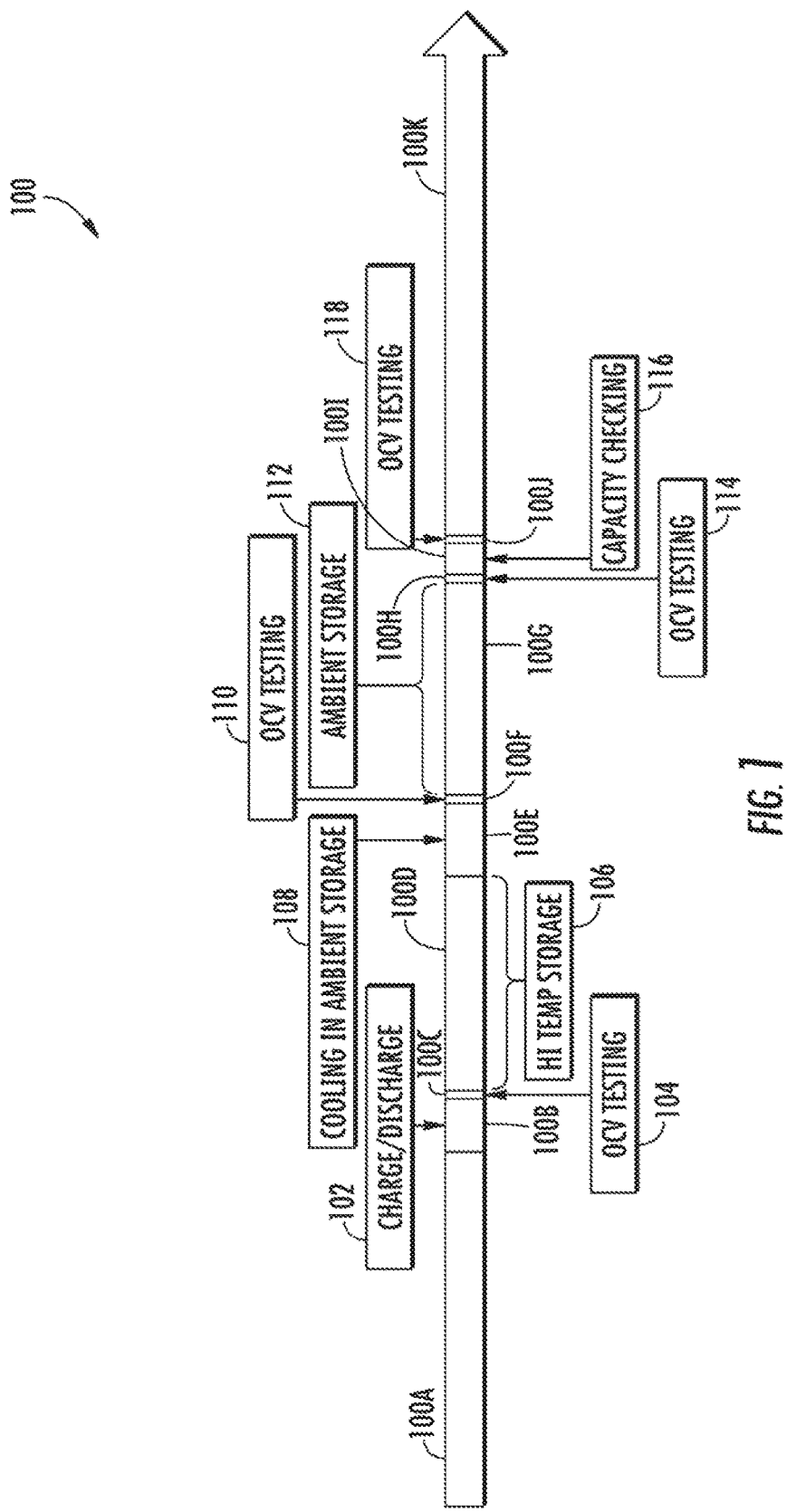
FIG. 1 shows an example process timeline for cell formation.

FIG. 1 shows an example process timeline 100 for cell formation. The context of this timeline is that it begins after the cells have been assembled, and it runs through a series of steps or stages of conditionings and quality checks that are designed to identify which cells are fully functioning and to eliminate those that do not meet specifications. Examples of various steps and stages in the cell formation timeline will be described below.

The assembly process that precedes the timeline 100 can be performed as known from existing techniques. However, in the interest of providing background for the following description, some exemplary aspects will be mentioned. A lithium-ion cell essentially consists of electrodes (anode and cathode) that are often rolled up (into a so-called "jelly roll") and then placed inside a suitable housing together with an electrolyte. Some cells have the 18650 form factor, to name just one example. That is, the cell assembly can begin with preparing the jelly roll and inserting it into the housing (e.g., a can) together with any other necessary components (e.g., insulation). Electrolyte is added and the necessary electrical connections are made (e.g., connecting the negative electrode to the bottom of the can and the positive to a top cap assembly). The cell can's open end (typically the top) is then sealed and the assembly of the cell is finalized.

Focusing now on the timeline 100 itself, in this example it has been divided into time periods 100A-K, each of which corresponds to the performance or duration of one or more steps or stages. The time periods have different lengths that schematically exemplify the relative amounts of time. However, in other implementations one or more of the steps/stages can take more or less time than illustrated, and/or the timeline can include more or fewer of them. Some examples will now be described regarding the individual time periods 100A-K.

At 100A, one or more preparatory stages can be performed. The cells are arranged in a suitable way, such as in form of a cell array on a tray or in another container. The cells are subjected to storage in an environment of suitable characteristic considering the present stage of the manufacturing process. This refers to storing the cells at some temperature and under other appropriate conditions. The storage can be performed to allow the cell components to stabilize. The duration of the storage can vary, for example on the order of several days.

At 100B, the cells are subjected to a charge/discharge 102. The charge/discharge brings the cells near (or to) a full state of charge (SOC). The charging can therefore be done according to established procedures for lithium-ion cells, such as by first charging the cells using a constant current, and thereafter continuing the charging at a constant voltage. When the charging is finished, the cells are discharged at a suitable rate. For example, the charge/discharge stage can take on the order of several hours, depending on the cell capacity as well as the respective rates of charging and discharging.

At 100C, an OCV testing 104 is performed on each of the cells. That is, the voltage across each cell's terminals is measured and recorded at a time when the cells have at least a partial charge. For example, this charge could be the result of the the charge/discharge 102. It will be described in more detail below that the results of one or more OCV measurements indicate whether a particular cell meets the requirements. For example, the cell specification may specify that the OCV for a normal cell, when measured after the charge/discharge stage 102, should be within a particular voltage range. Accordingly, any cell that does not fall within the accepted range can be identified. For example, such a cell is then discarded/recycled.

At 100D, the cells are subjected to high temperature storage 106. One purpose of this stage is to alter the state of the cells in more or more desirable ways. This can alter the chemical relationships of the cell materials (e.g., the active materials and/or the electrolyte), such as by accelerating chemical processes therein, and can therefore be considered an "aging" process. The temperature of the aging process affects the speed of the chemicals process(es). The aging is therefore done at a higher temperature than, say, that at which the cells have previously been stored. In some implementations, the temperature of the storage 110 is about twice of an ambient temperature in ° C. For example, the high temperature can be on the order of 40-50° C.

If the aging process takes place using circulating air as the medium for the elevated temperature, then the aging is characterized by the heat transfer coefficient for air flow, such as about 10-250 kcal/(m$^2$·h·° C.). However, if the cells are instead placed in contact with a liquid-based thermal system then the heat transfer coefficient for the liquid can instead determine the rate of heat transfer. For example, the heat transfer coefficient for water is about 250-5000 kcal/(m$^2$·h·° C.). The high temperature storage can be continued for an extended period, such as on the order of one or several days.

Using a liquid-based thermal system can provide one or more advantages. For example: the temperature of each cell can be stabilized faster and more evenly, the difference in aging among cells in the same batch (e.g., on a single tray) can be reduced, energy can be saved and the aging time can be shortened (e.g., by as much as half), OCV defect detection accuracy can be improved (e.g., by as much as 30%), and/or the accuracy of cell capacity measurement can be improved.

Any suitable liquid-based thermal system can be used that allows sufficient thermal contact between the cells and the liquid while allowing the amount or rate of heat transfer to be adequately regulated (e.g., by controlling the temperature of the liquid). Examples of thermal systems are described below with reference to FIGS. 3-6.

At 100E, the cells are subjected to cooling, such as in an ambient storage 108. That is, this stage brings the temperature of the cells down from the high temperature storage 106. In some implementations, the cooling can be done by exposing the cells to ambient air (that is, air cooler than the liquid of the preceding stage). In other implementations, however, the cooling can be performed using the liquid-based thermal system—that is, without moving or otherwise repositioning the cells—such as by lowering, the temperature of the liquid to effect the cooling. In some implementation the cooling can be done during a period that is on the order of several hours.

At 100F, an OCV test 110 is performed on each cell. As indicated above, one or more cells may have been discarded as defective earlier in the process and it will be understood that the current and other subsequent actions or measures are taken only with regard to cells that are still remaining in the manufacturing process. The OCV measurement for each cell is recorded and can be compared with any previous data to evaluate the characteristics of the cell. For example, the OCV test 110 can set a baseline value to be compared with a later measurement.

At 100G, the cells are subjected to ambient storage 112. In some implementations, the ambient storage occurs at the normal indoor temperature of a factory or plant where the manufacturing and/or formation take place. For instance, the ambient temperature can be on the order of 20° C., such as in the range of 20-26° C. to name just one example. For example, the ambient storage 112 can continue for a period on the order of multiple days.

At 100H, OCV testing 114 is performed on each cell. This testing can be done in a similar or identical way to the OCV tests 104 and/or 110. The OCV testing 114 can be compared to one or more previous tests for an individual cell to determine if that cell meets specifications. For example, the difference in voltage (if any) for an individual cell between the OCV tests 110 and 114—that is, the voltage degradation that results a certain time after charging—can be determined. As indicated earlier, it is desirable to reduce the variations in aging (i.e., the chemical processes) between individual cells, and this testing and comparison helps establish what variations exist.

At 100I the cells are subjected to capacity checking 116. In some implementations, the capacity checking involves a cycle of charging, discharging, and then charging the cells. For example, the cells can first be charged with a constant current up to a predetermined voltage (e.g., the cell's target voltage), and thereafter charged at a constant voltage until the charging current falls below a certain level. The cells can then be discharged, for example by a constant current until the cell reaches a predetermined voltage. Finally, the cells can be charged up to a predetermined level (e.g., a particular SOC). That is, the charging/discharging/charging seeks to establish the capacity of each cell to receive and deliver electric energy. For example, the capacity checking stage can take on the order of several hours per cell, depending on the cell capacity as well as the respective rates of charging and discharging.

At 100J, an OCV testing 118 is performed on each cell. Similar to previously described tests, this OCV test indicates the present characteristics of the cell which can be compared with previous values.

At 100K, the cells that remain in the formation process are subjected to suitable post-processing before use. The post-processing can involve regulating the environment surrounding the cells according to a predefined protocol. Thereafter, the cell formation is considered to be complete and the cells are ready to be used. The cells can be sold to a third party or assembled into a product, to name just two examples.

Figure 2:
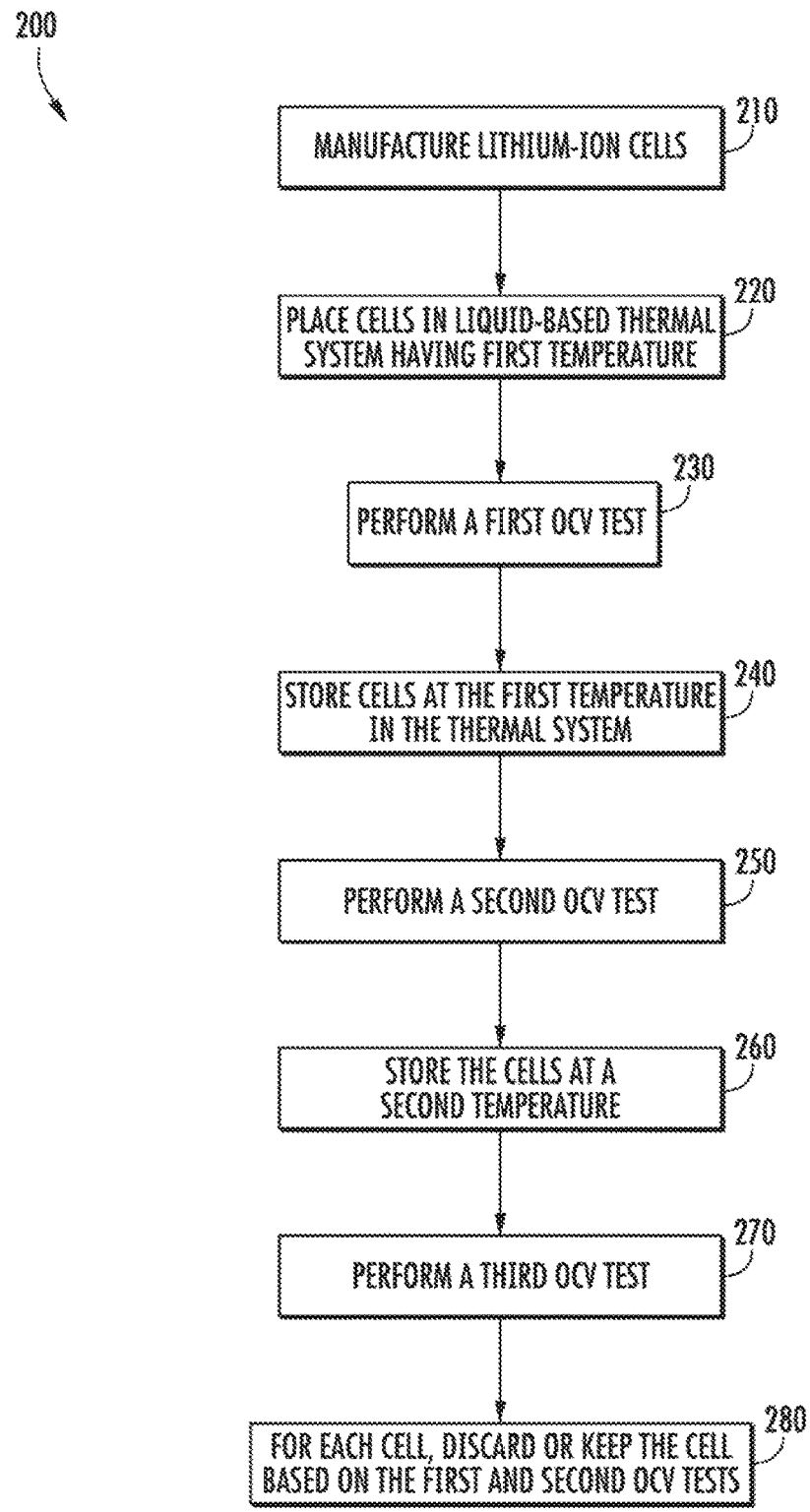
FIG. 2 shows a flowchart of an example of a method of manufacturing cells.

FIG. 2 shows a flowchart of an example of a method 200 of manufacturing cells. The steps can be performed in a different order unless the nature of the operation(s) dictates otherwise. Also, more or fewer operations can be performed in some implementations.

At 210, lithium-ion cells are manufactured. That is, this involves the initial assembly of the cell components into a common unit. In some implementations, an amount of electrical charging (e.g., the charge discharge 102) can be performed.

At 220, cells are placed in a liquid-based thermal system. For example, any of the systems shown in FIGS. 3-6 can be used. The system has a temperature selected based on the type of thermal conditioning that is to be performed. For example, the liquid in the system can be heated to a first temperature corresponding to the high temperature storage 106.

At 230, a first OCV test can be performed. In some implementations, the test is performed closely after placing the cells in a high-temperature storage. The test determines the voltage difference between the electrodes of each cell. The measured value for each cell can be recorded and associated with the individual cell in any suitable way. As an example, and without limitation, the recorded information can include the OCV data, a batch number for the cells, a number of the tray holding the set of cells, and the cell's position on the tray.

At 240, the cells are stored at the first temperature in the thermal system. That is, the heated liquid can be circulated so as to maintain the cells at a designated temperature for the amount of time that the storage lasts. As indicated earlier, this can be designed to provide controlled aging of the cells within the manufacturing process. In some implementations, the cells are actively cooled (e.g., using the thermal system) at the end of the high temperature heat conditioning. In other implementations, the cells can be indirectly cooled merely by deactivating (or removing the cells from) the thermal system.

At 250, a second OCV test is performed. The test determines the voltage difference between the electrodes of each cell. The measured value for each cell can be recorded and associated with the individual cell in any suitable way. As an example, and without limitation, the recorded information can include the OCV data, a batch number for the cells, a number of the tray holding the set of cells, and the cell's position on the tray.

At 260, the cells are stored at a second temperature lower than the first temperature. Solely as an example, the second temperature can be approximately ambient, or room, temperature. For example, if an active cooling is performed at the end of step 240 (that is, after the high temperature storage), the active cooling brings the cells to the second temperature selected for the present step.

At 270, a third OCV test is performed. The terms first, second and third for the OCV tests are here used only to distinguish them from each other and do not signify the absence or presence of any other OCV tests in the formation process. For example, FIG. 1 shows an example where at least four OCV tests are performed. If any of the first, second and third OCV tests are to be compared with each other, they should be as similar to each other as possible. For example, the second (and/or third) OCV test should also determine the voltage difference between the electrodes of each cell following the storage of step 260. The difference between the OCV tests then indicates, for the individual cell, how much that cell's OCV has diminished during the storage period, which is an indication of cell quality.

At 280, each cell is discarded or kept based at least in part on the first, second and/or third OCV tests. For example, a cell that has an excessive voltage degradation in a subsequent OCV test can be considered defective (or at least inferior) and can be removed from the manufacturing process. The OCV tests can also provide other useful information. For example, if some cells have a significantly greater voltage degradation than other cells that were aged at the same time (i.e., using the same thermal system), this could indicate a problem with the thermal system itself, which can then be investigated and remedied as necessary.

Some examples of thermal systems will now be described. FIGS. 3-6 show examples of liquid-based thermal systems 300, 400, 500 and 600 that can be used in methods or processes described herein. The shown examples have in common that a number of cells 310 are in thermal contact with a liquid flowing inside some form of conduit. The liquid is maintained at a temperature suited to a high temperature aging process for cells (e.g., similar to the storage 106 performed in FIG. 1) and this can be accomplished by applying a heater directly or indirectly to the liquid. For example, one or more heating elements can be immersed in the liquid and regulated by a thermostat to control the liquid temperature. As another example, a liquid-to-liquid heat exchanger can be provided so as to apply heat from a separate system (e.g., a central source of hot liquid) to the liquid contained in the thermal system. In all thermal systems, the liquid is circulated through a flow path (e.g., a closed loop) in any suitable way, for example using one or more pumps. Yet another example is that the tray(s) can facilitate electrical connection to the cells. For example, the tops of the cells (e.g., the positive terminals) are here not obstructed by the trays; this allows them to be contacted using suitable electrical equipment. An opposite terminal (e.g., the negative one) can be contacted by connecting to the side of the cell housing for cells having such a design. On the other hand, if the other end of the cell (i.e., the bottom end) must be accessible then the tray can be provided with suitable openings that allow access to that end of each cell.

For simplicity, the present illustrations do not explicitly show the liquid itself, a heater, a pump or the rest of the flow path for the liquid, or any electrical contactors. Rather, the description focuses on how the thermal contact between cells and liquid is created.

Figure 3:
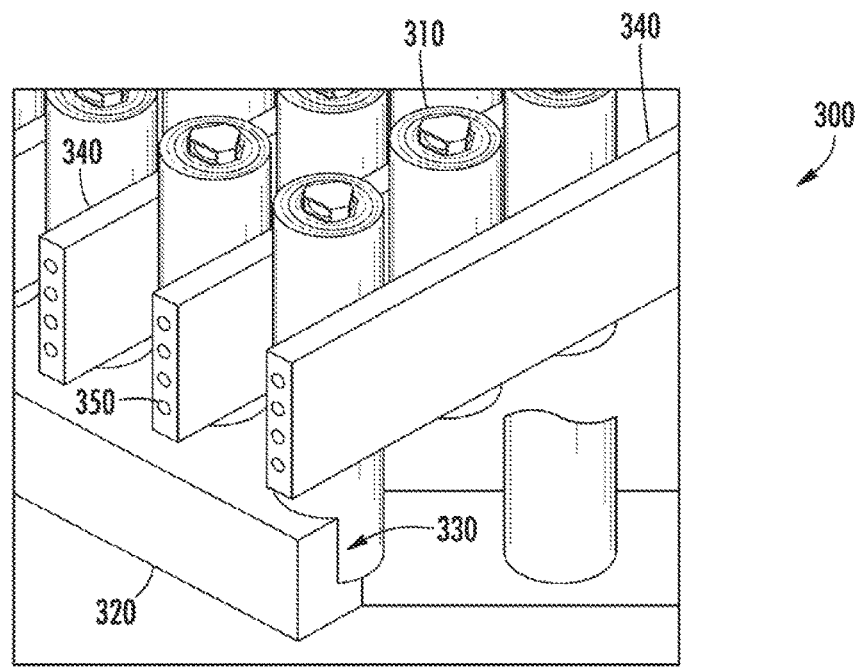
FIGS. 3-6 show examples of liquid-based thermal systems that can be used in methods or processes described herein.
Figure 4:
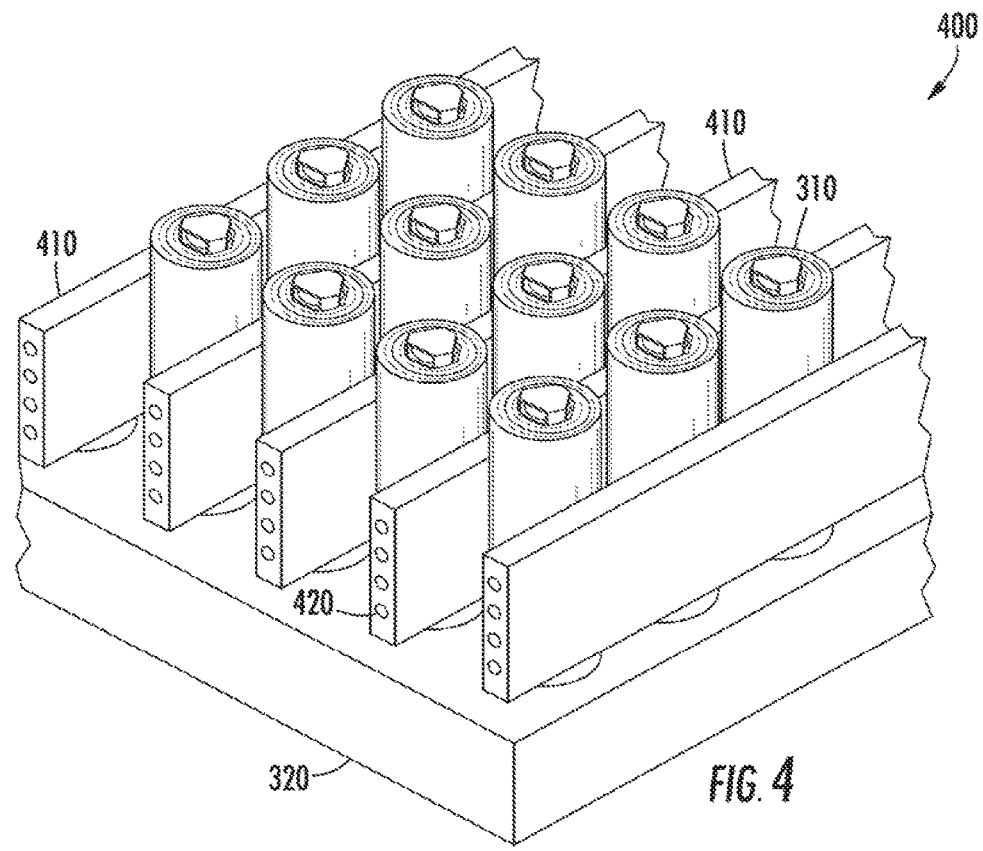
Figure 5:
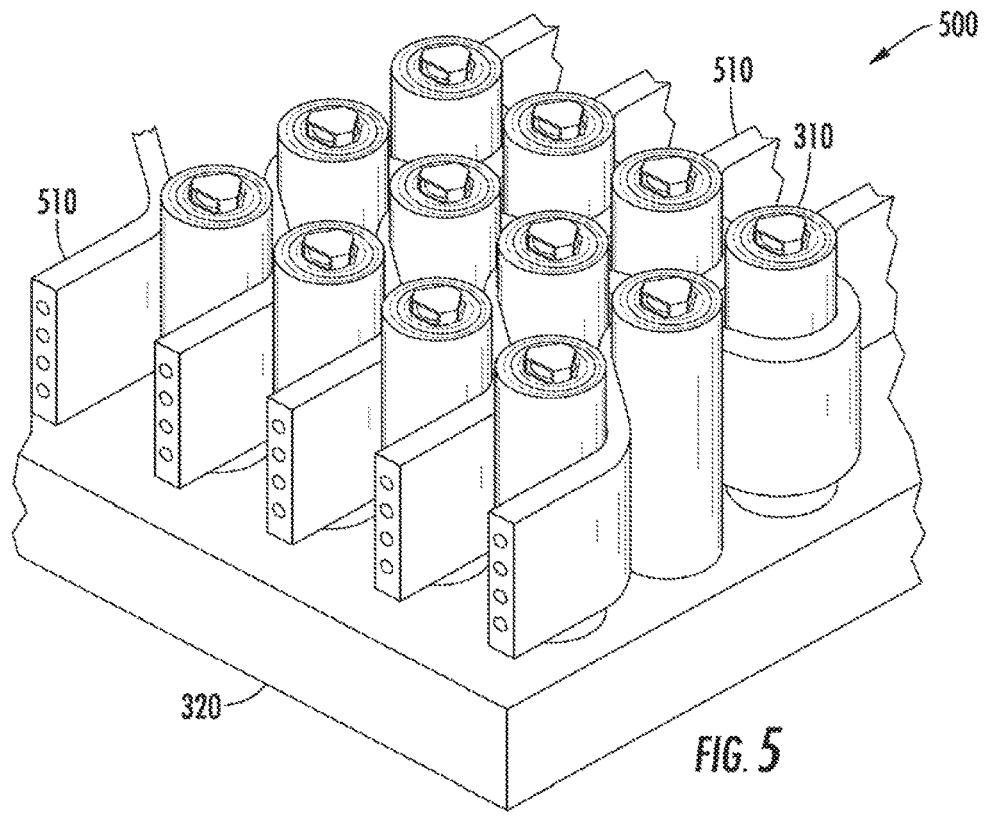

In each of FIGS. 3-5, the cells 310 are placed inside a tray 320 that keeps each cell in position by fixing a lower portion of the cell (e.g., the negative terminal). Beginning with the system 300, the tray 320 is shown in partial cross-section which illustrates a socket 330 having an inner diameter that allows the bottom end of one cell to be inserted. The tray 320 can be made from any suitable material, including, by not limited to, a polymer or metal. The sockets 330 are arranged in a regular pattern on the tray so as to position the cells in an array of suitable form. In the system 300, heating tubes 340 are positioned between individual cells. For example, each tube can be aligned with a row or column of cells and run essentially from end to end of the tray. The tubes are arranged parallel to each other so that each side of the tube is in contact with cells, and moreover, so that each cell is contacted by at least two of the tubes. The tube can be made from any suitable material, including, but not limited to, metal or polymer. For example, the tube can be extruded as a straight component that is then bent into a particular shape to fit in between the cells.

Each tube has a plurality of lumens 350 that serve as conduits for the liquid. The lumens are here visible because the tubes are shown in partial cross-section. In an actual implementation, on the other hand, the tubes 340 are segments of a closed loop that facilitates circulation of the liquid. As such, each cell is contacted by at least two tube segments that are in turn part of the same continuous tube. Here, each tube has three lumens 350 but more or fewer lumens can be used.

Turning now to the system 400 in FIG. 4, it has the cells 310 positioned in the tray 320 as noted earlier. However, tubes 410 running between rows of the cells here have four lumens 420 instead. More or fewer lumens can be used in other implementations.

Continuing with the system 500 in FIG. 5, the cells 310 positioned in the tray 320 are here in thermal contact with an undulating tube 510. Here, the tube partially wraps around each individual cell. Particularly, the wrapping occurs in an alternatingly clockwise and counter-clockwise direction for each respective cell. This arrangement can provide increased thermal contact between the cells and the tube so as to improve the efficiency of the high temperature storage and thereby improve the aging process. The tubes are here shown as separate segments but would in reality be connected to each other so a continuous loop is formed for the liquid.

Figure 6:
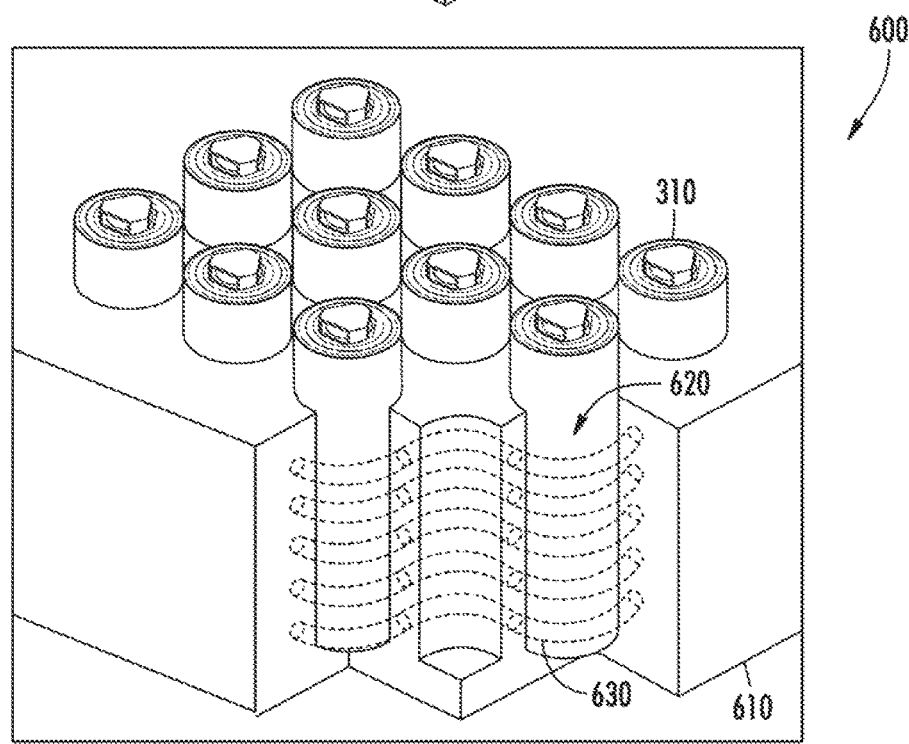

The system 600 in FIG. 6, on the other hand, uses a tray 610 that is different than in the previous examples. First, sockets 620 formed in the tray are deeper so as to contain a greater portion of each cell therein, which is illustrated in the partial cross-section of the drawing. Second, the tray has built into it some or all of the tubes that provide the fluid flow. For example, a tube 630 is shown to partially wrap around one of the cells and thereafter continue to the next cell, which it also wraps around in a partial fashion, albeit in the opposite direction. The tray 610 can be made from any suitable material, including, but not limited to, metal or polymer. For example, the tray can be assembled from modular blocks that each has segments of the tubes 630 through them, each block providing one or more of the sockets 620 for the cells.

A number of implementations have been described as examples. Nevertheless, other implementations are covered by the following claims.

What is claimed is:

1. A method of manufacturing cells comprising:
   assembling cells that include at least electrodes and electrolyte contained in a housing;
   after assembly, storing the cells in thermal contact with a liquid-based thermal system;
   circulating liquid in the liquid-based thermal system at least while the cells are in thermal contact with the liquid-based thermal system, the liquid having a first temperature;
   after storing the cells at the first temperature, and while the cells have at least a partial charge, performing a first open circuit voltage (OCV) test on the cells;
   after the first OCV test, storing the cells at a second temperature lower than the first temperature;
   after storing the cells at the second temperature, performing a second OCV test on the cells; and
   for each of the cells, discarding or keeping the cell based at least in part on the first and second OCV tests.

2. The method of claim 1, wherein the second temperature is about half the first temperature in ° C.

3. The method of claim 1, wherein the second temperature is about 20-25° C.

4. The method of claim 1, further comprising, after the assembly and before storing the cells at the first temperature:
   subjecting the cells to an initial storage;
   after the initial storage, charging the cells with initially a constant current and thereafter at a constant voltage;
   after charging, discharging the cells at least partially; and
   after discharging, performing a third OCV test on the cells, wherein each of the cells is discarded or kept based at least in part on the first, second and third OCV tests.

5. The method of claim 1, further comprising, after storing the cells at the first temperature and before the first OCV test, cooling the cells to the second temperature.

6. The method of claim 5, wherein cooling the cells to the second temperature comprises circulating liquid having the second temperature in the liquid-based thermal system.

7. The method of claim 1, further comprising performing a capacity check on the cells after the second OCV test.

8. The method of claim 7, wherein the capacity check comprises:
charging the cells with initially a constant current and thereafter at a constant voltage equal to a target voltage of the cells;
after charging, discharging the cells to below a predefined state-of-charge (SOC);
after discharging, charging the cells to the predefined SOC; and
after charging the cells to the predefined SOC, performing a third OCV test on the cells, wherein each of the cells is discarded or kept based at least in part on the first, second and third OCV tests.

9. The method of claim 1, further comprising, for those of the cells that are kept after the first and second OCV tests, storing the kept cells.

10. A method of manufacturing lithium-ion cells comprising:
assembling cells, the cells including at least electrodes and electrolyte in a housing;
after assembly, subjecting the cells to a first storage at a first temperature;
after the first storage period, performing a charge/discharge of the cells, the charge/discharge including initially charging the cells with a constant current, thereafter charging the cells at a constant voltage, and thereafter discharging the cells at least partially;
after the charge/discharge, performing a first open circuit voltage (OCV) test on the cells;
after the first OCV test, subjecting the cell to a second storage period in thermal contact with a liquid-based thermal system;
circulating liquid in the liquid-based thermal system at least during the second storage period, the liquid having a second temperature higher than the first temperature;
after the second storage period, cooling the cells from the second temperature down to about the first temperature;
after cooling the cells down to about the first temperature, performing a second OCV test on the cells;
after the second OCV test, subjecting the cells to a third storage period at the first temperature;
after the third storage period, performing a third OCV test on the cells;
after the third OCV test, performing a capacity check on the cells by charging the cells with initially a constant current and thereafter at a constant voltage equal to a target voltage of the cells, after charging, discharging the cells at least below a predefined state-of-charge (SOC), and, after discharging, charging the cells to the predefined SOC;
after the capacity check, performing a fourth OCV test on the cells, wherein each of the cells is discarded or kept based in part on at least one of the first, second, third and fourth OCV tests; and
for those of the cells that are kept after the fourth OCV test, subjecting the cells to a fourth storage period at the first temperature.

11. The method of claim 10, wherein the second temperature is about twice the first temperature in ° C.

12. The method of claim 10, wherein cooling the cells from the second temperature down to about the first temperature comprises circulating liquid having the first temperature in the liquid-based thermal system.

* * * * *